United States Patent [19]

Takeuchi et al.

[11] Patent Number: 5,139,856

[45] Date of Patent: Aug. 18, 1992

[54] PLATED CERAMIC OR GLASS SUBSTRATE HAVING UNDERCOAT

[75] Inventors: Yukihisa Takeuchi; Azuma Yamamoto, both of Nagoya; Susumu Hama, Toyoake; Toshiki Goto, Nagoya, all of Japan

[73] Assignee: NGK Insulators, Ltd., Japan

[21] Appl. No.: 453,913

[22] Filed: Dec. 20, 1989

[30] Foreign Application Priority Data

Dec. 20, 1988 [JP] Japan .................. 63-320875

[51] Int. Cl.$^5$ ............................. B32B 15/00
[52] U.S. Cl. .................... 428/216; 428/215; 428/434; 428/457; 428/469; 428/472; 428/498; 428/499; 428/704; 428/195
[58] Field of Search ............... 219/541, 543; 428/426, 428/432, 434, 698, 699, 704, 332, 215, 216, 547, 569, 472, 195

[56] References Cited

U.S. PATENT DOCUMENTS

| | | | |
|---|---|---|---|
| 4,168,343 | 9/1979 | Arai et al. | 428/432 |
| 4,296,309 | 10/1981 | Shinmi et al. | 219/543 |
| 4,327,967 | 5/1982 | Groth | 428/632 |
| 4,450,201 | 5/1984 | Brill et al. | 428/336 |
| 4,535,000 | 8/1985 | Gordon | 427/355.1 |
| 4,546,050 | 10/1985 | Amberger et al. | 428/623 |
| 4,652,727 | 3/1987 | Hoshizaki et al. | 219/541 |
| 4,690,871 | 9/1987 | Gordon | 428/432 |
| 4,826,525 | 5/1989 | Chesworth et al. | 65/60.2 |
| 4,861,669 | 8/1989 | Gullery | 428/434 |
| 4,920,006 | 4/1990 | Gullery | 428/432 |

FOREIGN PATENT DOCUMENTS

| | | |
|---|---|---|
| 57198695 | 12/1982 | Japan . |
| 5893397 | 6/1983 | Japan . |
| 2141741 | 1/1985 | United Kingdom . |

*Primary Examiner*—Ellis P. Robinson
*Assistant Examiner*—Archene Turner
*Attorney, Agent, or Firm*—Parkhurst, Wendel & Rossi

[57] ABSTRACT

A plated ceramic or glass substrate having a plated surface, wherein an undercoat is formed between the surface of the substrate and the plating film. The undercoat includes nitrogen and at least one of chromium and titanium as major components thereof.

10 Claims, 1 Drawing Sheet

(UNIT: $\mu$m)

(UNIT: $\mu m$)

(UNIT: $\mu m$)

PLATED CERAMIC OR GLASS SUBSTRATE HAVING UNDERCOAT

BACKGROUND OF THE INVENTION

1. Field of the Invention

The present invention relates to a plated substrate which is made of a ceramic or glass material and has a surface covered by a plating layer or film. More particularly, the present invention is concerned with such plated ceramic or glass substrate which has sufficiently high bonding strength of the plating film to the substrate surface and exhibits excellent physical properties and durability.

2. Discussion of the Prior Art

A technique for forming an electrically conductive layer or film on a surface of a ceramic or glass substrate has been widely utilized in various fields of industry, for example, in the field of preparing substrates for electronic components. One of commonly practiced methods for forming such electrically conductive film is a so-called "thick-film forming" process such as screen-printing. Recently, however, there have been efforts made to apply a plating process to the formation of a conductive film on the ceramic or glass substrate, in an attempt to obtain the film having improved properties and facilitate the process steps for producing the plated substrate.

Nevertheless, there has not established any predictably reliable plating process which satisfies all of the requirements, such as power or ability of covering the desired surface area of the substrate, and physical properties, bonding strength or adhesive force and surface smoothness of the film formed on the substrate. For instance, an alumina substrate widely used as a typical ceramic substrate for hybrid integrated circuits (HIC) or other electronic components is metallized by a plating process, in place of a conventionally widely practiced thick-film method using a paste. In this case, the plating process provides better results in terms of the physical properties and surface smoothness of the plating film, but suffers from considerably low ability in terms of the force of adhesion of the film to the substrate surface.

To solve the above problem, the following methods have been proposed:

1) The surface of the alumina substrate is roughened by etching or other suitable means, as disclosed in published U.K. Patent Application GB-2 141 741A.

2) A porous under layer or undercoat is formed of a suitable material such as ceramic or glass, on the surface of the alumina substrate to be plated.

3) Where a copper plating is formed on the alumina substrate, a copper aluminate layer is formed between the copper plating film and the alumina substrate surface, for increasing the bonding strength of the copper plating by chemical bonding, as disclosed in Publication No. 58-93397 of unexamined Japanese Patent Application.

4) The substrate surface is covered by an undercoat formed of a metal such as Cr or Ti, which exhibits affinity to both the alumina substrate and the plating layer, as proposed in Publication No. 57-198696.

The first method 1) does not have sufficient stability in the bonding strength of the plating film, and tends to cause variation in the bonding strength of the plating film in the local areas of the substrate surface. The third method 3) suffers from some problems. For example, the copper plating film may be deteriorated due to oxygen trapped within the formed copper aluminate layer. Further, the copper aluminate may be reduced to copper, by means of tin (Sn) used as a solder on the substrate, during a durability test of a product which uses the substrate subjected to a soldering process. Thus, the third method 3) is not reliable in assuring sufficient bonding strength of the plating film.

In the second method 2), the roughness or undulation of the porous undercoat more or less reflects on the smoothness of the plating film. Namely, the relatively low smoothness of the plating film makes it difficult to accurately form a desired electrically conductive pattern by processing the film. Further, the reduced smoothness deteriorates the electrical properties of the conductive pattern, and lowers the ease of mounting components on the substrate (final product using the substrate). Moreover, since the porous undercoat is a ceramic or glass material insulating the alumina substrate and the conductive plating film, the heat dissipation and electrical properties of the substrate are adversely affected by the properties of the insulating undercoat which are inferior to those of the alumina substrate.

The fourth method 4) suffers from variation in the uniformity of an oxide film formed on the Cr or other metal undercoat. This variation results in lowering the ability of the applied plating film to cover the desired surface area of the substrate. That is, the oxide film may prevent the plating film from being uniformly formed on the entire area of the desired substrate surface to be plated. Further, the metal (e.g., Cr) used as the undercoat may diffuse into the plating film when the plated substrate is heat treated, if necessary.

SUMMARY OF THE INVENTION

It is therefore an object of the present invention to provide a plated ceramic or glass substrate which is considerably improved in terms of the surface covering and bonding strength of a plating film formed on the substrate.

The above object may be suitably achieved according to the principle of the present invention, which provides a plated ceramic or glass substrate having a plating film formed to cover at least a portion of a surface thereof, wherein an undercoat is formed between the surface of the substrate and the plating film, and the undercoat comprises as major components thereof nitrogen, and at least one of chromium and titanium.

The plating film preferably comprises copper as a major component thereof, and at least a portion of the undercoat desirably consists of an electrically conductive nitride.

According to the present invention, the electrically conductive undercoat whose major components comprise nitrogen and one or both of Ti and Cr is not influenced by a hard and dense oxide film which may be formed on a conventionally used metallic undercoat. Therefore, the plating film may be formed so as to cover the entire area of the desired substrate surface to be plated. It is also noted that the electrically conductive undercoat of the instant substrate which includes both of Cr and/or Ti as a metallic element and nitrogen as a non-metallic element has affinity to both the substrate and the plating film, whereby the instant plated substrate has increased strength of bonding and thermal conductivity between the plating film and the substrate.

Accordingly, the plated substrate according to the present invention may find wide applications in various fields of technology which use metallized substrates which are ceramic or glass substrates plated with a metallic material. The present plated substrate can be suitably used for semi-conductor packages, chip carriers, hybrid integrated circuits (HIC), ceramic wiring boards, heaters, print heads, and other electronic components and devices. These components and devices which use the present substrate are significantly improved in quality, owing to enhanced electrical conductivity and soldering wettability of the plating film of the instant substrate. Further, the plating film of the instant plated substrate may be suitably bonded to a metallic member, or to another ceramic or glass substrate or a ceramic or glass member.

BRIEF DESCRIPTION OF THE DRAWINGS

The above and other objects, and features and advantages of the present invention will be better understood by reading the following detailed description of the invention, when considered in connection with the accompanying drawings, in FIG. 1(a) and FIG. 1(b), respectively, show the thicknesses ($\mu$m) of Ni plating films measured at selected positions, which are formed on a substrate according to the invention having an undercoat whose major components consist of Cr and N, and on a comparative substrate having a Cr undercoat.

DETAILED DESCRIPTION OF THE INVENTION

Figure 1A:
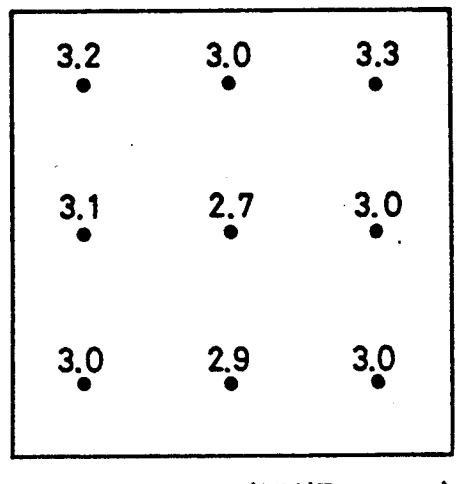

The substrate according to the present invention is formed of a ceramic, glass or any other inorganic material except metals. For example, the material for the substrate is desirably or suitably selected from the group including: a ceramic material or composition which consists of or includes as major component or components, at least one of oxide type ceramics such as alumina, beryllia, zirconia, magnesia, mullite and forsterite; a ceramic material or composition which consists of or includes as major component or components, at least one of non-oxide type ceramics such as silicon carbide, silicon nitride, aluminum nitride, boron nitride, boron carbide and titanium boride; a dielectric or piezoelectric ceramic material or composition which consists of or includes as a major component or components, at least one of perovskite type or composite perovskite type compounds such as $PbZrO_3$, $PbTiO_3$, $BaTiO_3$, $SrTiO_3$, and $Pb(Fe_{2/3}W_{1/3})O_3$, $Pb(Ni_{1/3}Nb_{2/3})O_3$; a glass material or composition such as quartz glass, soda glass, lead glass, and borosilicate glass; a glass ceramics such as those containing mica, cordierite or spodumene; and a mixture of ceramic and glass materials as indicated above. The surface of the substrate formed of the material as indicated above by way of example only may be ground, polished, glazed, glass-coated or otherwise treated as needed to improve the smoothness, or roughened as needed to improve the force of adhesion of the later formed undercoat to the substrate surface.

The major components of the undercoat formed on the substrate surface consist of nitrogen (N), and at least one metal element except nitrogen, in particular, in the form of a stable electrically conductive nitride of chromium (Cr) and/or titanium (Ti). However, the metal element need not be present in the form of a nitride. The inclusion of nitrogen and at least one of Cr and Ti as the major components of the undercoat makes it possible to effectively increase the bonding strength of the plating film with respect to the substrate surface (undercoat). Particularly, a combination of nitrogen (N) and chromium (Cr) as the major components of the undercoat is preferred from the standpoint of the bonding strength, ease of processing and covering ability of the plating film to be formed on the undercoat. The following are some of the examples of this combination: $Cr_2N$, CrN, $Cr_2N$-CrN, Cr-$Cr_2N$, Cr-CrN, Cr-$Cr_2N$-CrN and Cr-Mo-N.

The undercoat of the plated substrate of the present invention may be formed by a printing process, a coating process, a physical deposition process such as vacuum vapor deposition, sputtering and ion plating, a chemical deposition process such as CVD, or a thermal spraying process. If the required bonding strength can be obtained, the undercoat may be formed by any known process. However, the sputtering method is suitably employed. The undercoat in the final or eventual form need not be formed in one process step. For instance, a layer of chromium (Cr) is first formed by deposition, and the Cr layer is heat-treated in an nitrogen atmosphere or a nitrogen-hydrogen atmosphere so that nitrogen is absorbed in the heat-treated Cr layer, so as to convert the Cr layer into a Cr-N substance. As an alternative preferred method, a Cr-O or Cr-S substance may be treated under reducing condition, as in a nitrogen-hydrogen atmosphere, so that the treated substance is converted into a Cr-N substance. The method is selected from among the above-indicated processes, so as to efficiently form the undercoat with a desired thickness, while satisfying the various requirements associated with the subsequent fabrication steps of the plated substrate, such as post-deposition treatment of the undercoat, and formation and subsequent treatment of the plating film.

The thickness of the undercoat is suitably determined, depending upon the materials of the substrate and the plating film, and the utility or application of the plated substrate. Generally, the thickness is held within a range between 0.001 $\mu$m (inclusive) and 20 $\mu$m (inclusive). Where the substrate is used as a substrate for electronic circuits formed from the plating film, the thickness is preferably held within a range of 0.05 $\mu$m (inclusive) and 5 $\mu$m (inclusive).

The material for the plating film formed on the undercoat consists of or includes as a major component or components, at least one of Au, Ag, Cu, Ni, Pt, Sn and other metals. For instance, the following materials may be used for the plating film: Ag-Pd; Ag-Pt; Ni-P; Ni-B; Ni-W-P; and Ni-W-B. For improved wettability with respect to the undercoat whose major components are N [nitrogen] and at least one of Cr and Ti, Cu, Ni, Au and Sn may be desirably used as major components of the plating material. In particular, Cu is desirable for high electrical conductivity and soldering wettability.

The method of applying the above-indicated plating material to the undercoat is selected from various electroplating processes in a bath using an aqueous solution, a non-aqueous solution, a suspension or a melt, or from various chemical or electroless plating processes using a reducing agent such as hypophosphite, sodium borohydride (sodium boron hydride), formalin or tartarate. However, any other plating methods such as vacuum plating or vapor phase plating may be utilized. To improve the structural quality, bonding strength and other properties of the formed plating film, the plating film may be suitably heat-treated under appropriate conditions (including treating atmospheres and temperature). Further, the plating film may be a multi-layer film consisting of a first Ni layer and a second Au layer formed on the Ni layer, or a first Cu layer and a second Au layer formed on the Cu layer.

The above-indicated methods for forming the undercoat and the plating film may be suitably combined with pattern forming methods such as a full-additive method, a semi-additive method and a subtractive method, so that a desired conductive pattern is formed of a plating material on the substrate. For instance, a layer of chromium is formed on the substrate surface and this chromium layer is photo-etched to form a pattern corresponding to the desired conductive pattern. Then, the formed chromium pattern is subjected to a suitable process so that the chromium pattern absorbs nitrogen. These steps for forming a patterned Cr-N undercoat are effected in the order indicated above, since a pure chromium layer is more easily etched than a chromium layer including nitrogen. In this case, the patterned Cr-N undercoat is covered by a plating material such as Cu or Ni applied by a selected chemical plating or electroplating process. The thus formed conductive plating pattern exhibits improved bonding strength with respect to the substrate, and has enhanced dimensional and configurational accuracy.

The electrical conductivity of the Ti-N or Cr-N undercoat formed according to the principle of the present invention is affected by the composition and heat treating conditions of the undercoat, but is close to that of a metal. Further, the present undercoat is free of a hard and dense oxide film which may arise on a metal chromium undercoat. Namely, the present undercoat has a high resistance to oxidation. With these excellent properties of the undercoat according to the invention, the plating material may be easily applied so as to cover the entire area of the surface that should be plated. Further, the undercoat permits excellent thermal conductivity between the plating film and the substrate. In addition, the undercoat including Cr and/or Ti as a major metal element or elements and N as a major non-metal element exhibits high affinity to both of the ceramic or glass material of the substrate and the conductive material of the plating film, whereby the plating film is formed with a sufficient force of adhesion to the substrate (undercoat).

Particularly, the Cr-N undercoat in the form a nitride has a remarkably high resistance to oxidation and high uniformity of electrical resistance at its surface, as compared with the known Cr or other metallic undercoat. Accordingly, the instant undercoat assures improved uniformity in the thickness and structural quality of the electroless or electro plating layer, and prevents blistering of the plating film. Furthermore, the nitrogen present in the undercoat serves to prevent diffusion of atoms of chromium of the undercoat into the plating film when the plated substrate is heat-treated.

EXAMPLES

To further clarify the principle of the present invention, some examples of the invention will be described, for illustrative purposes only. It is to be understood that the invention is by no means limited to the details of the following examples, and that the invention may be embodied with various changes, modifications and improvements which may occur to those skilled in the art, without departing from the spirit and scope of the invention defined in the appended claims.

EXAMPLE 1

Electrically conductive films having a thickness of 1.0 $\mu$m were formed on respective alumina ceramic substrates (10 cm $\times$ 10 cm square plate), by sputtering Ti or Cr in an ordinary manner in an atmosphere containing Ar and $N_2$ gases. The formed electrically conductive films were analyzed by X-ray photoelectron spectroscopy instrument ESCA 750 available from Simazu Corporation, Japan. The measurements revealed the presence of nitrogen as well as Ti or Cr as a major component of the films. Namely, the sputtered metal was sufficiently nitrided or nitrogenized, to provide an undercoat whose major components consist of titanium (Ti) or chromium (Cr) and nitrogen (N).

Then, each substrate with the thus prepared undercoat was plated by using a nickel Watts bath as indicated below. As a result, a Ni plating film was formed on the undercoat.

| Nickel Watts Bath | |
|---|---|
| Nickel sulfate | 240 g/l |
| Nickel chloride | 45 g/l |
| Boric acid | 30 g/l |
| Bath temperature | 50° C. |
| Current density | 3A/dm$^2$ |

A comparative specimen was prepared by forming a Ni plating film on a Cr undercoat which was formed by sputtering in an Ar gas. The plating conditions were the same as indicated above.

Figure 1B:
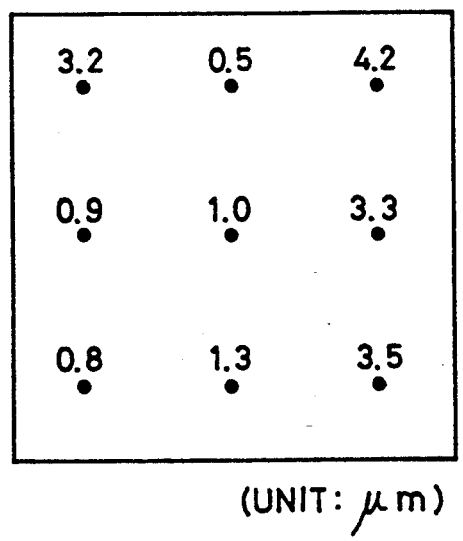

The thickness of the Ni plating films on the Ti-N and Cr-N undercoats on the specimens according to the present invention and on the Cr undercoat of the comparative specimen was measured at nine positions by a fluorescent coating thickness gauge SFT-157SHM available from Seiko instruments and electronics LTD., Japan. FIG. 1(a) shows the measured thickness values (unit: $\mu$m) of the plating film formed on the Cr-N undercoat according to the invention, while FIG. 1(b) shows the measured thickness values ($\mu$m) of the plating film formed on the Cr undercoat of the comparative specimen.

It will be understood from FIG. 1(a) that the average thickness of the Ni plating film on the nitrogenized Cr undercoat according to the invention is 3.0 $\mu$m, with a variation held to within 0.6 $\mu$m. On the other hand, the average thickness of the Ni plating film on the Cr undercoat of the comparative specimen substrate is 2.2 $\mu$m, with a variation as large as 3.7 $\mu$m. This indicates that the Ni plating film formed on the electrically conductive undercoat whose major components are Cr and N according to the invention exhibited better uniformity in the deposition thickness, owing to the Cr-N undercoat which provided the plating film with increased ability of covering the desired surface area of the substrate, with the film having a substantially constant thickness over its entire area.

The measurement of the thickness of the Ni plating film formed on the Ti-N undercoat of the substrate according to the invention also revealed better results in terms of the uniformity of the thickness, than a comparative specimen wherein the plating film was formed on the Ti undercoat. Namely, the variation in the thickness of the plating film on the nitrided Ti undercoat according to the invention was as small as 0.6 $\mu$m, while the variation in the thickness of the plating film on the Ti undercoat was as large as 3 μm or more.

EXAMPLE 2

A chromium film having a thickness of 3 μm was formed on an alumina ceramic substrate similar to that used in Example 1, by sputtering Cr in an ordinary atmosphere containing Ar.

The thus formed chromium film was heat-treated at 980° C. in a $N_2$-$H_2$ atmosphere. The electrically conductive chromium film on the substrate was then analyzed by the above-indicated X-ray photoelectron spectroscopy instrument. The analysis revealed the co-existence of nitrogen together with chromium, as a major component in the electrically conductive film. The film was also analyzed to identify the crystalline phases, by X-ray diffraction analysis. The analysis showed the presence of $Cr_2N$ and $CrN$ phases. Thus, the chromium film formed on the substrate was found to be sufficiently nitrogenized, with nitrogen (N) as well as chromium (Cr) included as the major component. A further experiment confirmed that the heating temperature to nitride the film should be 600° C. or higher, more preferably, 800° C. or higher.

The thus prepared undercoat on the substrate was treated and plated with copper, in an electroplating process using a copper sulfate plating bath as indicated below. As a result, a 10 μm thick Cu plating film was formed on the undercoat.

| Plating Bath | |
|---|---|
| Copper sulfate | 75 g/l |
| Sulfuric acid | 190 g/l |
| Chlorine ions | 60 mg/l |
| Glazing agent | as needed |
| Temperature | 25° C. |
| Current density | 3 A/dm$^2$ |

Under the same condition, a Cu plating film was formed on a non-nitrogenized chromium undercoat on the same substrate. Thus, a comparative specimen was prepared.

An analysis of the Cu plating films formed on the Cr-N undercoat according to the invention and on the Cr undercoat of the comparative specimen revealed results similar to those described with respect to Example 1. Namely, the undercoat whose major components are Cr and N permitted the Cu plating film to have comparatively higher bonding strength and exhibit comparatively improved ability of covering the substrate surface with a substantially constant thickness. The Cu film on the Cr-N undercoat was free of blisters, and had a thickness variation of as small as 5 82 m. On the other hand, the Cu film formed on the non-nitrogenized Cr undercoat of the comparative specimen had local blisters, and had a thickness variation as large as 9 μm.

EXAMPLE 3

A Ni plating film was formed in an ordinary electroless plating process, on a 0.5 μm thick Cr-N undercoat which was formed under the same condition as in Example 2 except that the initially formed Cr film was heat-treated at 950° C. in a $N_2$ gas atmosphere.

Described in detail, the Cr-N undercoat was first de-greased by a de-greasing agent, and then sensitized by adsorption of $Sn^{2+}$ ions on the de-greased undercoat. After the sensitized undercoat was rinsed, it was activated by adsorption of $Pd^{2+}$ ions on the rinsed undercoat. After the activated undercoat was rinsed, the Ni plating film was formed by electroless plating using a bath containing sodium hypophosphite as a reducing agent. The steps for treating the Cr-N undercoat and applying the Ni plating film to the undercoat are indicated below:

| (1) | Sensitizing | |
|---|---|---|
| | $SnCl_2$ | 10 g/l |
| | Hydrochloric acid | 3% |
| (2) | Rinsing | |
| (3) | Activating | |
| | $PdCl_2$ | 0.1 g/l |
| | Hydrochloric acid | 3% |
| (4) | Rinsing | |
| (5) | Electroless Ni Plating | |
| | $NiSO_4.6H_2O$ | 10 g/l |
| | Sodium citrate | 30 g/l |
| | Sodium hypophosphite | 10 g/l |
| | Temperature | 50° C. |

Thus, the 3 μm thick Ni plating film was deposited over the entire area of the Cr-N undercoat, without blisters and without a thickness variation. Then, the Ni plating film was etched by a photolithographic method, to form a 2 mm ×2 mm pad of nickel. Subsequently, the Ni pad was plated with a 0.5 μm thick Au film. A tin-plated copper wire having a diameter of 0.6 mm was soldered to the Au plating film. A tensile strength test was conducted by pulling the copper wire until the Cr-N undercoat was separated from the substrate due to destruction at the substrate surface. The test revealed the tensile strength of 8 kg.

For comparison, a Ni electroless plating film was formed on a non-nitrogenized Cr undercoat of a comparative specimen. The Ni plating film suffered from many local blisters, and a test showed tensile strength of as low as 1.0 kg, which indicated an accordingly low bonding strength between the Cr undercoat and the substrate surface.

EXAMPLE 4

As indicated below, a 3.0 μm thick electroless copper plating film was formed on a 0.1 μm thick Cr-N undercoat which was prepared in the same manner as in Example 2.

| (1) | Activating | |
|---|---|---|
| | $PdCl_2$ | 0.2 g/l |
| | Hydrochloric acid | 3% |
| (2) | Rinsing | |
| (3) | Electroless Cu Plating | |
| | $CuSO_4.5H_2O$ | 10 g/l |
| | EDTA | 50 g/l |
| | Formalin (27 wt. % HCHO) | 300 ml/l |
| | Organic additive | as needed |
| | Surfactant | as needed |
| | Temperature | 60° C. |

The Cu plating film had no blisters, and a test showed tensile strength of 7 kg at which the Cu film was peeled off due to destruction at the substrate surface.

An electroless Cu plating was effected on a non-nitrogenized Cr undercoat, as a comparative specimen. However, no deposition of copper occurred on the Cr undercoat.

It will be understood that the Cr undercoat containing nitrogen according to the present invention is effective also to an electroless copper plating.

What is claimed is:

1. A metal plated substrate comprising:
   a glass or ceramic substrate;
   a actual plated film which covers at least a portion of a surface of said substrate; and
   an electrically conductive undercoat formed between and continuous with both the surface of said substrate and said metal plated film, said undercoat consisting essentially of nitrogen and at least one metal selected from the group consisting of chromium and titanium.

2. The metal plated substrate of claim 1, wherein said metal plated film comprises copper.

3. The metal plated substrate of claim 1, wherein said metal plated film comprises nickel.

4. The metal plated substrate of claim 1, wherein said substrate consists of alumina.

5. The metal plated substrate of claim 1, wherein at least a portion of said electrically conductive undercoat consists of an electrically conductive nitride.

6. The metal plated substrate of claim 1, wherein said electrically conductive undercoat consists essentially of chromium and nitron.

7. The metal plated substrate of claim 1, wherein said electrically conductive undercoat has a thickness ranging from 0.001 $\mu$m-b 20.0 $\mu$m.

8. The metal plated substrate of claim 1, wherein said electrically conductive undercoat has a thickness ranging from 0.05 $\mu$m-5.0 $\mu$m.

9. A metal plated substrate comprising:
   a glass or ceramic substrate;
   a metal plated film which covers at least a portion of a surface of said substrate; and
   an electrically conductive undercoat formed between the surface of said substrate said said metal plated film, said electrically conducive undercoat consisting essentially of nitrogen and at least one metal selected from the group consisting of chromium and titanium;
   wherein when said metal plated film has an average thickness ranging from 3.0 $\mu$m-10 $\mu$m, said metal plated film has a variation in thickness ranging from 20-50%, respectively.

10. A metal plated substrate comprising:
    a glass or ceramic substrate;
    a metal plated film which covers at least a portion of a surface of said substrate; and
    an electrically conductive undercoat formed between the surface of said substrate and said metal plated film, said electrically conductive undercoat consisting essentially of nitrogen and at least one metal selected from the group consisting of chromium and titanium;
    wherein when said electrically conductive undercoat has a thickness ranging from 0.2 $\mu$m-0.5 $\mu$m, said electrically conductive undercoat has a tensile bonding strength to the surface of said substrate ranging form 7 kg-8 kg, respectively.

* * * * *